United States Patent [19]
Hirai

[11] Patent Number: 5,404,239
[45] Date of Patent: Apr. 4, 1995

[54] LIQUID CRYSTAL DISPLAY WITH FLEXIBLE CIRCUIT HOLDING DRIVER CIRCUIT HAVING NOTCHES FOR ENGAGING CURABLE MEMBER

[75] Inventor: Minoru Hirai, Kyoto, Japan

[73] Assignee: Rohm Co., Ltd., Kyoto, Japan

[21] Appl. No.: 56,460

[22] Filed: May 4, 1993

[30] Foreign Application Priority Data

May 20, 1992 [JP] Japan ................. 4-154302

[51] Int. Cl.⁶ ................. G02F 1/1343; G02F 1/1333; H01L 39/02
[52] U.S. Cl. ........................... 359/88; 359/83; 439/67; 361/749; 174/254
[58] Field of Search .............. 359/87, 88, 83; 257/666, 668; 361/749; 174/253, 254; 439/67, 77, 83, 378, 736

[56] References Cited

U.S. PATENT DOCUMENTS

| | | | |
|---|---|---|---|
| 5,042,919 | 8/1991 | Yabu et al. | 359/88 |
| 5,166,774 | 11/1992 | Banerji et al. | 174/253 |
| 5,168,384 | 12/1992 | Genba | 359/88 |
| 5,173,369 | 12/1992 | Kataoka | 257/666 |

FOREIGN PATENT DOCUMENTS 0441398  8/1991  European Pat. Off. .

*Primary Examiner*—William L. Sikes
*Assistant Examiner*—Kenneth Parker
*Attorney, Agent, or Firm*—Nikaido, Marmelstein, Murray & Oram

[57] ABSTRACT

A liquid crystal display device including a liquid crystal display panel having an electrode terminal, a circuit board having a driving circuit for the liquid crystal panel and a circuit terminal portion, and a connection wiring which is held in a flexible film and connects the electrode terminal with the circuit terminal portion, wherein the circuit terminal portion is located on the circuit board at a predetermined distance from a side edge of the circuit board; and the flexible film is held by a curable fixing member provided on the circuit board at a distance smaller than the predetermined distance from the side edge of the circuit board.

6 Claims, 5 Drawing Sheets

LIQUID CRYSTAL DISPLAY WITH FLEXIBLE CIRCUIT HOLDING DRIVER CIRCUIT HAVING NOTCHES FOR ENGAGING CURABLE MEMBER

FIELD OF THE INVENTION

The present invention relates to liquid crystal display devices. More particularly, it relates to an improved structure of a connection between a flexible film provided with a connection wiring (hereinafter referred to as "TAB") and a circuit board, wherein an electrode terminal of a liquid crystal display panel is connected with a terminal of the circuit board by means of the TAB. On the circuit board, there is formed a driving circuit for driving the liquid crystal panel.

BACKGROUND OF THE INVENTION

In constructing a liquid crystal display panel of large size, a circuit for driving pixels of a liquid crystal display panel also needs to be large. Hence, there is generally employed a method wherein a circuit board having a driving circuit for the panel is connected with the panel. With this method, to construct a larger-size liquid crystal display device by combining multiple panels, there is a need to bend the circuit board, toward the back side of the panels. In this case, the electrode terminals of the panels are connected with the terminal of the circuit board by means of TABs having a flexible property.

FIG. 3 is a schematic perspective view showing an example of a liquid display device wherein a liquid crystal display panel 12 is connected with a circuit board 11 by means of TABs 13, and the circuit board 11 is bent so as to be perpendicular to the panel 12. FIGS. 4 and 5 are enlarged explanatory views showing a connecting portion of the TAB. The TAB 13 is provided with an in opening 13a at one end thereof. Thereby, bare wires the TAB is connected with the circuit terminal portion of the circuit board 11 by means of solder 14. Further, the back side of film portion of the TAB 13 is bonded to the front side of the circuit board 11 with a double coated adhesive tape 15 at a side edge portion of the circuit board 11 so as to prevent pivotal movement of the circuit board 11 or the TAB 13 about the connecting portion connected by the solder, and disconnection in the connecting portion.

When the above structure is employed, however, the double coated adhesive tape 15 must be provided. Accordingly, the number of parts needed is increased. Further, the number of production steps is increased accompanying with a rise in production cost. Moreover, if the TAB 13 erroneously comes into contact with the reverse side of the adhesive tape 15 when the wires in the connection opening 13a are to be positioned to coincide with the circuit terminal portion of the circuit board 11, the film part of the TAB 13 is fixed by the adhesive force of the tape 15. Therefore, it is likely difficult to correct the position of the TAB. Such positioning before soldering requires a high precision since the wires to be connected with the connecting portion of the circuit board have a width of, for example, about 0.8 mm and an interval of about 0.4 mm between adjacent ones. Thus, the wires in the connection opening 13a cannot be precisely positioned due to the adhesive tape.

It should be noted that the TAB 13 is provided with an IC 16 so that signals are processed. Therefore, the liquid crystal display panel has 80 pieces of connecting wires, while the circuit board has 20 pieces of connecting wires.

SUMMARY OF THE INVENTION

According to the present invention, there is provided a liquid crystal display device including a liquid crystal display panel having an electrode terminal, a circuit board having a driving circuit for the liquid crystal display panel and a circuit terminal portion, and a connection wiring which is held in a flexible film and connects the electrode terminal with the circuit terminal portion, wherein the circuit terminal portion is located on the circuit board at a distance from a side edge of the circuit board; and the flexible film is held by a curable fixing member provided on the circuit board at a distance smaller than the distance from the side edge of the circuit board.

It is preferable that the curable fixing member forms a projection which engages a notch portion formed on said flexible film for holding said flexible film.

It is preferable that the curable fixing member is composed of solder.

It is preferable that the curable fixing member is composed of a liquid-type curable adhesive.

It is preferable that the connection wiring held in said flexible film is connected in the course thereof with an integrated circuit for signal processing.

It is preferable that the circuit terminal portion is connected with said connection wiring by means of solder.

It is preferable that the electrode terminal is connected with said connection wiring by means of an anisotropically conductive adhesive tape.

In the liquid crystal display device according to the present invention, the flexible film of a TAB is held by the curable fixing member provided nearer than the circuit terminal portion of the circuit board to the side edge of the circuit bard. Hence, the TAB and the circuit board can be prevented from pivoting about their connecting portion by a simple structure. Moreover, the curable fixing member can be placed in position after the connection wiring is connected with the circuit terminal portion of the circuit board. Hence, there is no difficulty in positioning the connection wiring of the TAB so as to coincide with the circuit terminal portion of the circuit board.

DETAILED DESCRIPTION

Now, the present invention will be described in detail by way of an embodiment with reference to the drawings.

Figure 1:
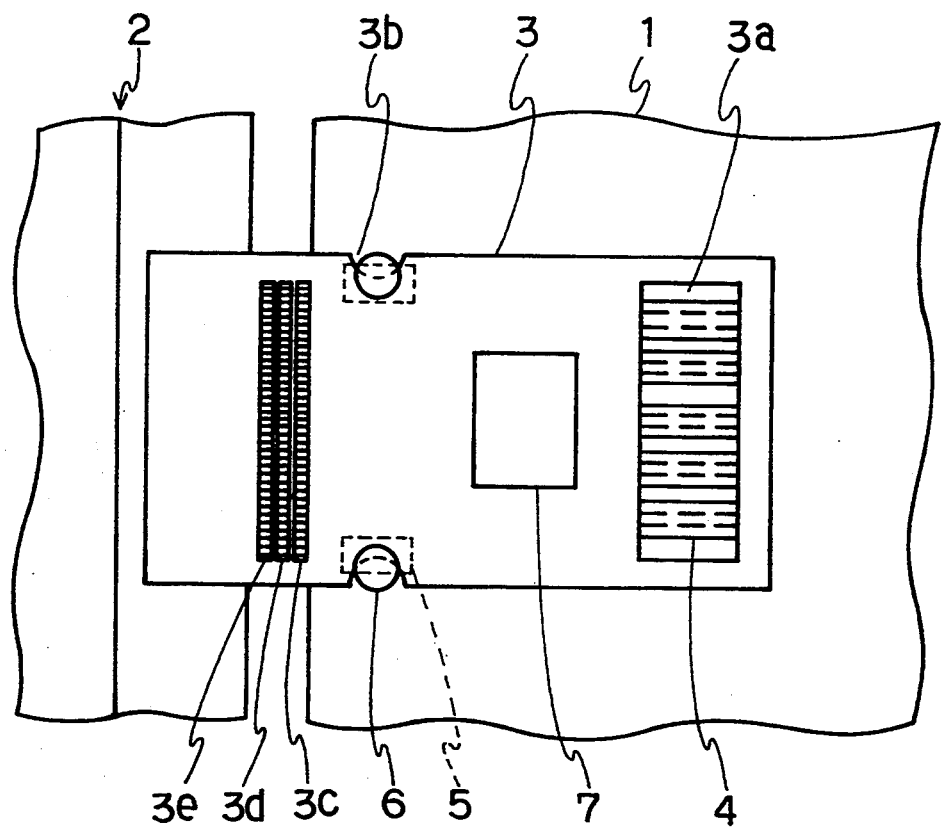
FIG. 1 is a schematic plan view showing a TAB portion of a liquid crystal display device embodying the present invention.
Figure 2:
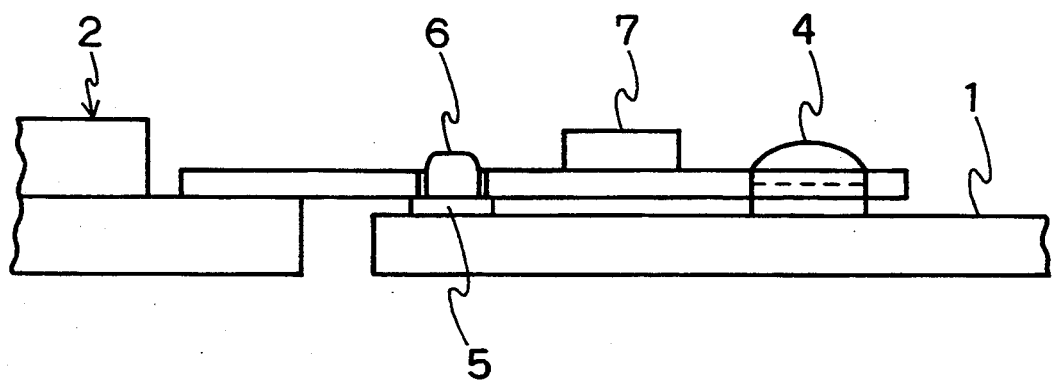
FIG. 2 is a side view of FIG. 1.
Figure 3:
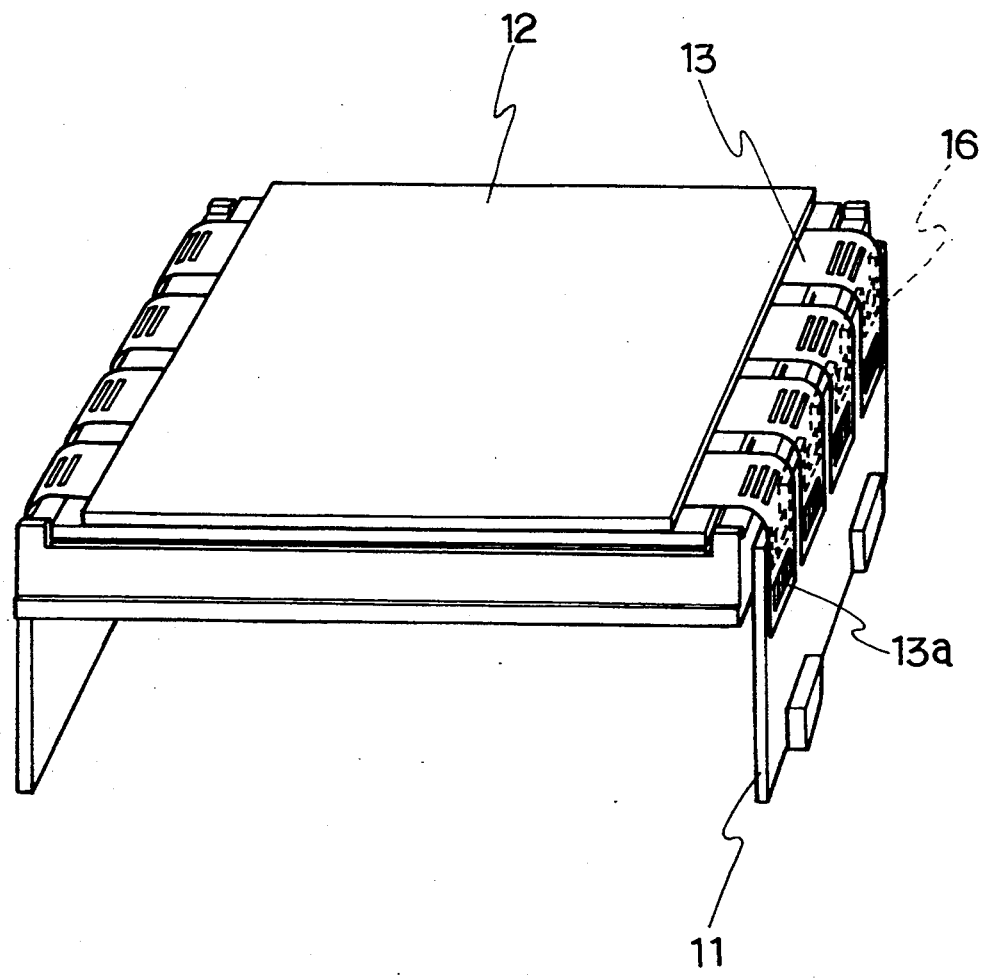
FIG. 3 is a perspective explanatory view showing an example of a liquid crystal display device in which a liquid crystal display panel and a circuit board are connected with each other by means of a TAB.
Figure 4:
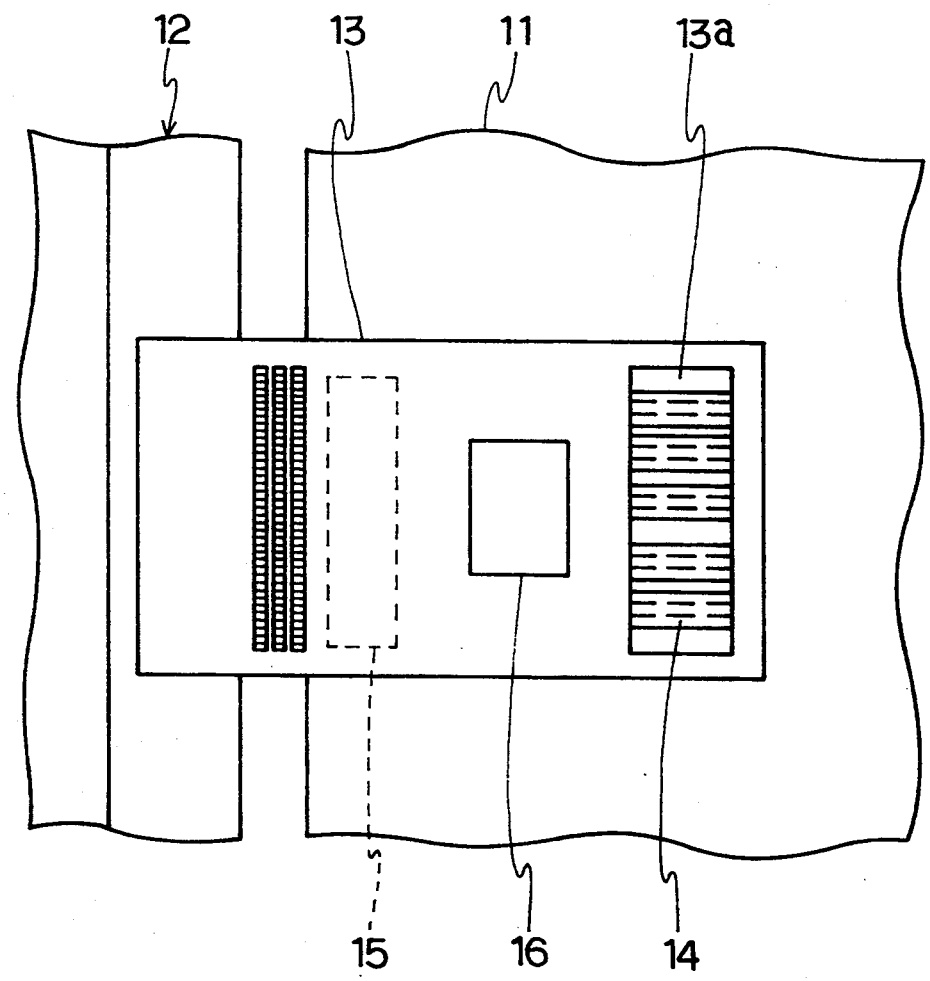
FIG. 4 is a plan view showing a TAB portion of a conventional liquid crystal display device.
Figure 5:
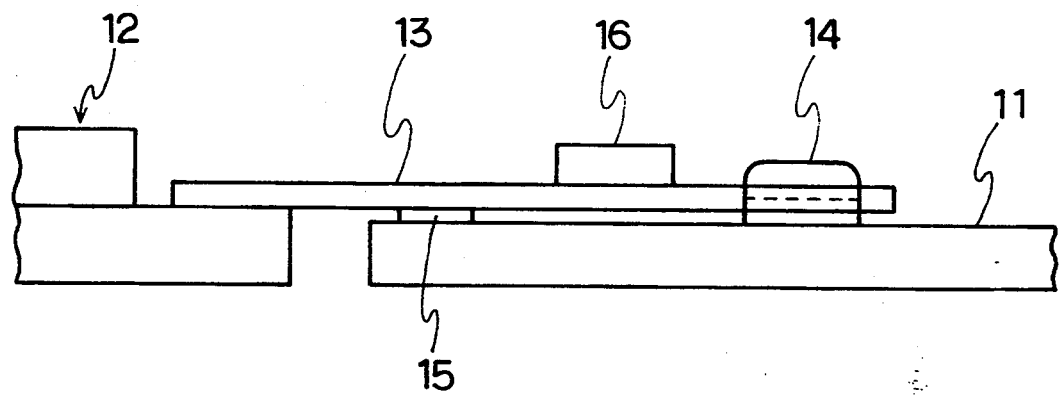
FIG. 5 is a side view of FIG. 4.

Referring to FIGS. 1 and 2, numeral 1 denotes a circuit board, numeral 2 denotes a liquid crystal display panel, numeral 3 denotes a TAB, numeral 4 denotes solder, numeral 5 denotes a dummy electrode, numeral 6 denotes solder (curable fixing member), and numeral 7 denotes an integrated circuit. With the structure of connection between the TAB 3 and the circuit board 1 in the liquid crystal display device embodying the present invention, the TAB 13 has a connection opening 3a which is located adjacent one end thereof like a TAB used in the conventional structure. A connection wiring bared in the opening 3a is connected with a circuit terminal portion (not shown) of the circuit board 1 by means of the solder 4.

A connection wiring which connects with the liquid crystal panel 2 has multiple fine wires, for example, about 80 wires as described above. Hence, such fine wires are connected with corresponding electrode terminals of the panel 2 by means of an anisotropically conductive adhesive film or the like. The anisotropically conductive adhesive film is an adhesive film which is electrically conductive in, for example, the longitudinal direction thereof while being insulative in the transverse direction. The TAB 3 is provided at a bending portion thereof with openings 3c, 3d and 3e which are formed by providing notches into the flexible film for allowing easy bending. In such openings 3c, 3d and 3e fine wires are bared. For this reason, if the TAB 3 is bent twice or more, a breaking of wire tends to occur. Accordingly, it is important to carefully handle the TAB 3 when the wires are connected and it is important to carefully handle the TAB 3 afterward for the operations that follow.

The flexible film portion of the TAB 3 is formed with a notch 3b of, for example, an arc-like shape on both longitudinal sides. A dummy electrode 5 is formed on the circuit board 1 at a location substantially coincident with the notch 3b. Solder, for example, is provided and melted on the dummy electrode to form a projection 6 thereon after connecting between the terminal portion of the circuit board 1 and the connection wiring of the TAB 3 in the opening 3a. This projection 6 provided on both longitudinal sides of the TAB 3 engages the notch 3b formed at the flexible film portion thereby to prevent the circuit board 1 or the TAB 3 from pivoting about the connecting portion in the opening 3a.

In the present embodiment, the solder 6 is melted and then cured to form a projection after soldering between the circuit terminal portion of the circuit board 1 and the connection wiring of the TAB 3. Hence, the positioning of the wiring to coincide with the circuit terminal portion can be accomplished without any trouble. The curable fixing member used in the present invention is a member which is curable after placement and capable of fixing the TAB 3 and the circuit board 1 relative to each other. Further, in the present embodiment there is no need to provide an additioned step for preventing pivotal movement of the circuit board 1 or the TAB 3 because solder is used as the curable fixing member. However, the curable fixing member used in the present invention is not limited to solder. The projection can be made of resin adhesive or the like instead of solder and which is then made to engage the notch provided on the flexible film portion of the TAB Accordingly, the TAB 3 is firmly secured and hence preventing the pivotal movement about the connecting portion. Without forming the projection, the flexible film portion of the TAB 3 can be bonded to the circuit board 1 by means of a liquid-type curable adhesive such as an instantaneous adhesive agent, for example, "ALON-α" (trademark, a product of KONISHI Co., Ltd.). In this case, as a matter of course, the formation of the dummy electrode is unnecessary.

As has been described, according to the present invention, with a simple structure wherein a TAB is connected with a circuit board by soldering the end portion of wiring of the TAB with a circuit terminal portion of the circuit board and which is also bonded thereto by means of a curable fixing member, pivotal movement of the TAB or the circuit board about such a soldering portion can be prevented. This contributes to prevention of a connection failure between the connection wiring of the TAB and the circuit terminal portion of the circuit board. In addition, since the TAB can be fixed to the circuit board by means of the curable fixing member after the connection wiring of the TAB is positioned to coincide with the circuit terminal portion of the circuit board and connected therewith by soldering, such a positioning operation can be achieved easily without damaging the connection wiring. Hence, the present invention assures a higher yield with decreased production steps.

Though several embodiments of the present invention are described above, it is to be understood that the present invention is not limited only to the above-mentioned, embodiment various changes and modifications may be made in the invention without departing from the spirit and scope thereof.

What is claimed is:

1. A liquid crystal display device comprising:
   a liquid crystal display panel having an electrode terminal;
   a circuit board having a driving circuit for the liquid crystal panel and a circuit terminal portion; and
   a connection wiring which is held in a flexible film and connects the electrode terminal with the circuit terminal portion,
   wherein the circuit terminal portion is located on the circuit board at a first distance from a side edge of the circuit board, and the flexible film is held by a curable fixing member provided on the circuit board at a second distance which is shorter than the first distance from the side edge of the circuit board and wherein said curable fixing member forms a projection which engages a notch portion formed on said flexible film for holding said flexible film.

2. The liquid crystal display device of claim 1, wherein said curable fixing member is composed of solder.

3. The liquid crystal display device of claim 1, wherein said curable fixing member is composed of a liquid-type curable adhesive.

4. The liquid crystal display device of claim 1, wherein said connection wiring held in said flexible film is connected in the course thereof with an integrated circuit for signal processing.

5. The liquid crystal display device of claim 1, wherein said circuit terminal portion is connected with said connected, wiring by means of solder.

6. The liquid crystal display device of claim 1, wherein said electrode terminal is connected with said connection wiring by means of an anisotropically conductive adhesive tape.

* * * * *